US011862226B2

(12) United States Patent
Sarpatwari et al.

(10) Patent No.: US 11,862,226 B2
(45) Date of Patent: Jan. 2, 2024

(54) SYSTEMS AND METHODS FOR PRE-READ SCAN OF MEMORY DEVICES

(71) Applicant: Micron Technology, Inc., Boise, ID (US)

(72) Inventors: Karthik Sarpatwari, Boise, ID (US); Fabio Pellizzer, Boise, ID (US); Nevil N. Gajera, Boise, ID (US); Yen Chun Lee, Boise, ID (US); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 17/463,152

(22) Filed: Aug. 31, 2021

(65) Prior Publication Data
US 2023/0067396 A1    Mar. 2, 2023

(51) Int. Cl.
*G11C 11/4074* (2006.01)
*G11C 7/10* (2006.01)
*G11C 11/4096* (2006.01)

(52) U.S. Cl.
CPC ........ *G11C 11/4074* (2013.01); *G11C 7/1063* (2013.01); *G11C 7/1069* (2013.01); *G11C 11/4096* (2013.01)

(58) Field of Classification Search
CPC . G11C 11/4074; G11C 7/1063; G11C 7/1069; G11C 11/4096
USPC ........................................................ 365/226
See application file for complete search history.

(56) References Cited

U.S. PATENT DOCUMENTS

| 11,195,575 B1* | 12/2021 | Patel ...................... G11C 5/025 |
| 2016/0077913 A1* | 3/2016 | Yao ....................... G11C 29/021 714/764 |
| 2019/0294495 A1* | 9/2019 | Takagiwa ............. G11C 7/1087 |
| 2020/0090779 A1* | 3/2020 | Tokutomi ........... G11C 16/3495 |

* cited by examiner

*Primary Examiner* — Fernando Hidalgo
(74) *Attorney, Agent, or Firm* — Fletcher Yoder, P.C.

(57) ABSTRACT

Methods and systems include memory devices with a memory array comprising a plurality of memory cells. The memory devices include a control circuit operatively coupled to the memory array and configured to receive a read request for data and to apply a plurality of read voltages to the memory array based on the read request. The control circuit is further configured to perform a data analysis for a first set of data read based on the application of the plurality of read voltages and to derive a demarcation bias voltage (VDM) based on the data analysis. The control circuit is also configured to apply the VDM to the memory array to read a second set of data.

20 Claims, 7 Drawing Sheets

SYSTEMS AND METHODS FOR PRE-READ SCAN OF MEMORY DEVICES

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, wordlines and bitlines are used to transmit selection signals to respective memory cells. The selection signals may include signals characterized by voltage levels used to save data into or retrieve data from the memory cells. The wordlines and bitlines may couple to selection signal sources through drivers. The memory cells may be organized into one or more layers of memory cells, such as layers defined between overlapping wordlines and bitlines. These layers may be referred to as decks (e.g., memory decks). Various combinations of the wordlines, bitlines, and/or decoders may be referenced for use in a particular memory operation using addresses (e.g., memory addresses). The address may indicate which memory cell is to be selected using a combination of signals from the wordlines, bitlines, and/or decoders, and a particular value of the address may be based on ranges of addresses of the memory device. A voltage may then be applied to selected wordlines and/or bitlines to cause memory cells to be turned on, for example, to read data from the memory cells. It may be beneficial to improve read techniques for threshold-type memories.

BRIEF DESCRIPTION OF THE DRAWINGS

Various aspects of this disclosure may better be understood upon reading the following detailed description and upon reference to the drawings in which.

DETAILED DESCRIPTION

Figure 1:
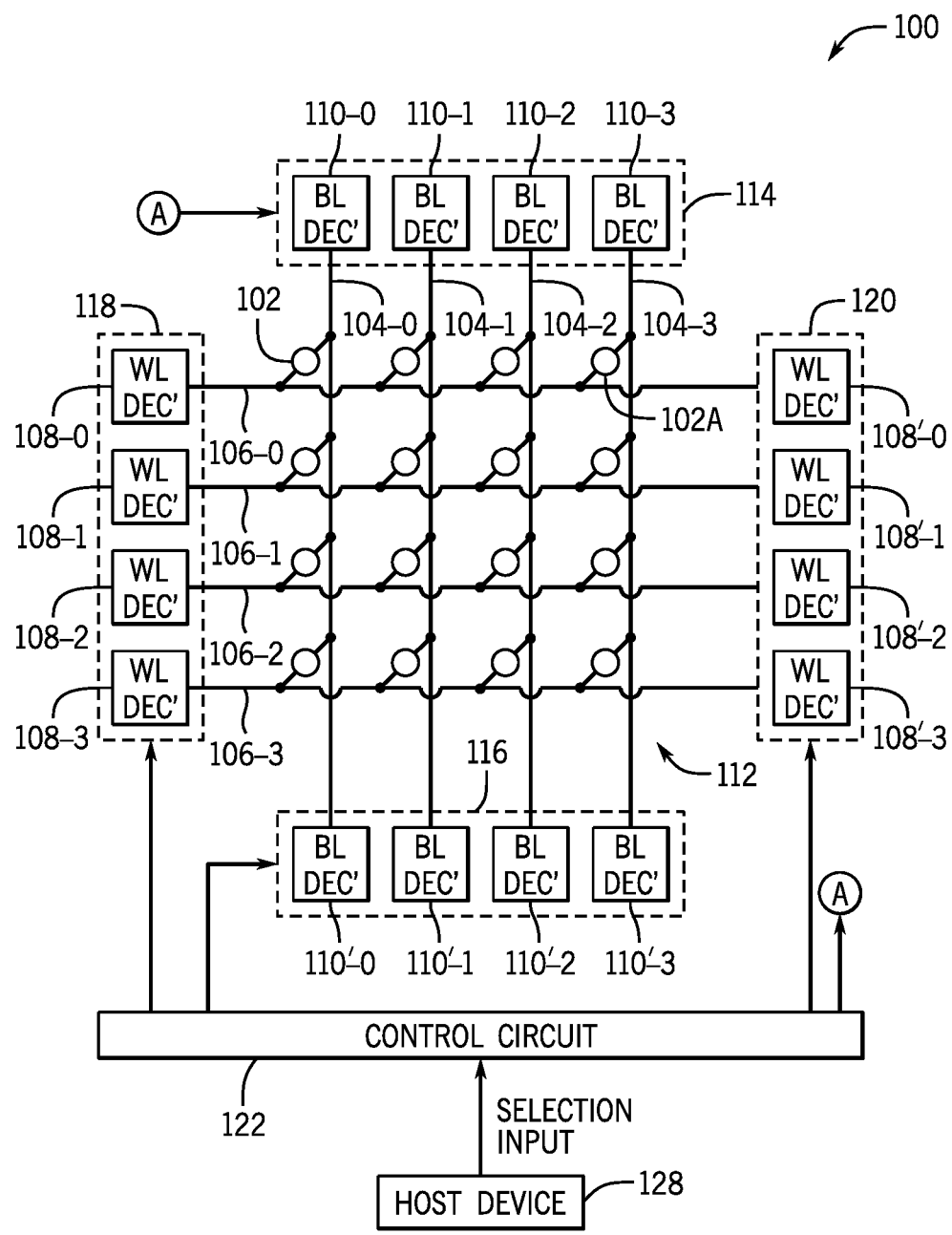
FIG. 1 is a simplified block diagram illustrating certain features of a memory device including a memory array of memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bitline and a wordline. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of wordlines and a layer of bitlines. The array may be a stack of decks that includes any number of decks of memory cells (e.g., 1 deck, 2 decks, 4 decks, any number of decks) as different layers of the array.

In some embodiments, a logic state of 1 (e.g., a SET state of a memory cell, which may also be referred to as a SET cell or bit) may correspond to a set of threshold voltages (Vths) lower than a set of threshold voltages associated with a logic state of 0 (e.g., a RESET state of a memory cell, which may also be referred to as a RESET cell or bit). Accordingly, a lower voltage may be used to read SET cells when compared to RESET cells. During operations, the threshold voltage for one or more memory cells may "drift". That is, as time increases, a higher threshold may now be used to read data when compared to an original starting threshold. According, the memory array may use active media management, such as monitoring tiles (e.g., tiles in a partition) and attempting to mitigate the impacts of drifting by deriving a new demarcation bias voltage (VDM) to be used to read the memory cells.

Instead of using active media management (e.g., tile level management), a pre-read scan technique described herein may apply a two-step (or more) read approach. In one embodiment, a first step (e.g., scan step) may include the application of multiple voltages (e.g., read voltages) to a memory array. In some embodiments, the read voltages may be applied in parallel via partitions, with each voltage having a different value, as further described below. The applied read voltages may initiate a series of switching events by activating the group of memory cells storing the data to be read. The switching event may be attributed to a memory cell turning on (e.g., conducting an appreciable amount of current) when the applied voltage across the memory cell exceeds the memory cell's threshold voltage (Vth).

The memory cells that have turned on may then be read, for example, as storing logic 1 (e.g., SET cells), and the remaining cells that have not turned on may be read as storing logic 0 (e.g., RESET cells). The read data may then be analyzed to determine which of the multiple read voltages applied was more optimal as further described below. The more optimal voltage may then be used for deriving a more optimal VDM and then applying the VDM during a second read step. Accordingly, the pre-read scan technique may more efficiently provide for read voltages when accessing data in the memory array.

Turning now to the figures, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell 102. Furthermore, the memory device 100 may include other circuitry, such as a biasing circuitry configured to bias the bitlines 104 or wordlines 106 in a corresponding direction. For example, the bitlines 104 may be biased with positive biasing circuitry while the wordlines 106 may be biased with negative biasing circuitry.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104) when selecting a target memory cell 102A from the memory cells 102. For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different.

Each of the bitlines 104 and/or wordlines 106 may be metal traces disposed in the memory array 112, and formed from metal, such as copper, aluminum, silver, tungsten, or the like. Accordingly, the bitlines 104 and the wordlines 106 may have a uniform resistance per length and a uniform parasitic capacitance per length, such that a resulting parasitic load may uniformly increase per length. It is noted that the depicted components of the memory device 100 may include additional circuitry not particularly depicted and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective of the wordline decoders 108 and/or bitline decoders 110 to perform memory operations, such as by causing the decoding circuitry (e.g., a subset of the wordline decoders 108 and/or bitline decoders 110) to generate selection signals (e.g., selection voltage and/or selection currents) for selecting a target of the memory cells. In some embodiments, a positive voltage and a negative voltage may be provided on one or more of the bitlines 104 and/or wordlines 106, respectively, to a target of the memory cells 102. In some embodiments, the decoder circuits may provide biased electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an electrical pulse to the target of the memory cells 102 such that the control circuit 122 is able to access data storage of the target memory cell, such as to read from or write to the data storage. After a target of the memory cells 102 is accessed, data stored within storage medium of the target memory cell may be read or written. Writing to the target memory cell may include changing the data value stored by the target memory cell. As previously discussed, the data value stored by a memory cell may be based on a threshold voltage of the memory cell. In some embodiments, a memory cell may be "set" to have a first threshold voltage or may be "reset" to have a second threshold voltage. A SET memory cell may have a lower threshold voltage than a RESET memory cell. By setting or resetting a memory cell, different data values may be stored by the memory cell. Reading a target of the memory cells 102 may include determining whether the target memory cell was characterized by the first threshold voltage and/or by the second threshold voltage. In this way, a threshold voltage window may be analyzed to determine a value stored by the target of the memory cells 102. The threshold voltage window may be created by applying programming pulses with opposite polarity biasing to the memory cells 102 (e.g., in particular, writing to selector device (SD) material of the memory cell) and reading the memory cells 102 (e.g., in particular, reading a voltage stored by the SD material of the memory cell 102) using a signal with a given (e.g., known) fixed polarity. In some embodiments, a selection input may be received from a host device 128, such as a host processor reading data from the memory device 100 to cause the control circuit 122 to access particular memory cells 102.

The control circuit 122 may additionally utilize a pre-read scan technique when reading data that may be stored in the memory cells 102, for example, by applying multiple read voltages to the memory cells 102 based on partitions. In one embodiment, the multiple read voltages may be applied in parallel, with one voltage being used per partition, where each voltage has a different value. The read voltages may be applied via bitlines 104 and wordlines 106. The applied read voltage may then cause an activation event (e.g., switching event) readable via the wordline decoders 108 and the bitline decoders 110. SET cells may activate at a first voltage threshold (Vth) lower than a second Vth of RESET cells.

In certain embodiments, the resulting read data (e.g., logic 1's and 0's) may have certain statistical assumptions. For example, the total number of logic 1's may be in a desired range between 35% to 65% of the total number of logic 0's. The read voltages applied may return data that may be outside of the desired range, for example, because the voltages applied may be too high or too low. A more optimal read voltage may result in data closer to or inside of the desired range. The control circuit 122 may derive the more optimal VDM, and then adjust one or more subsequent voltages based on the derivation. Accordingly, variances due to drift, write endurance (e.g., as more writes are performed later read voltages may be lower), and/or memory cell 102 distances (e.g., different read voltages may vary based on distances of stored data in bitlines 104), for example, may be accounted for using the pre-scan read technique described herein.

Figure 2:
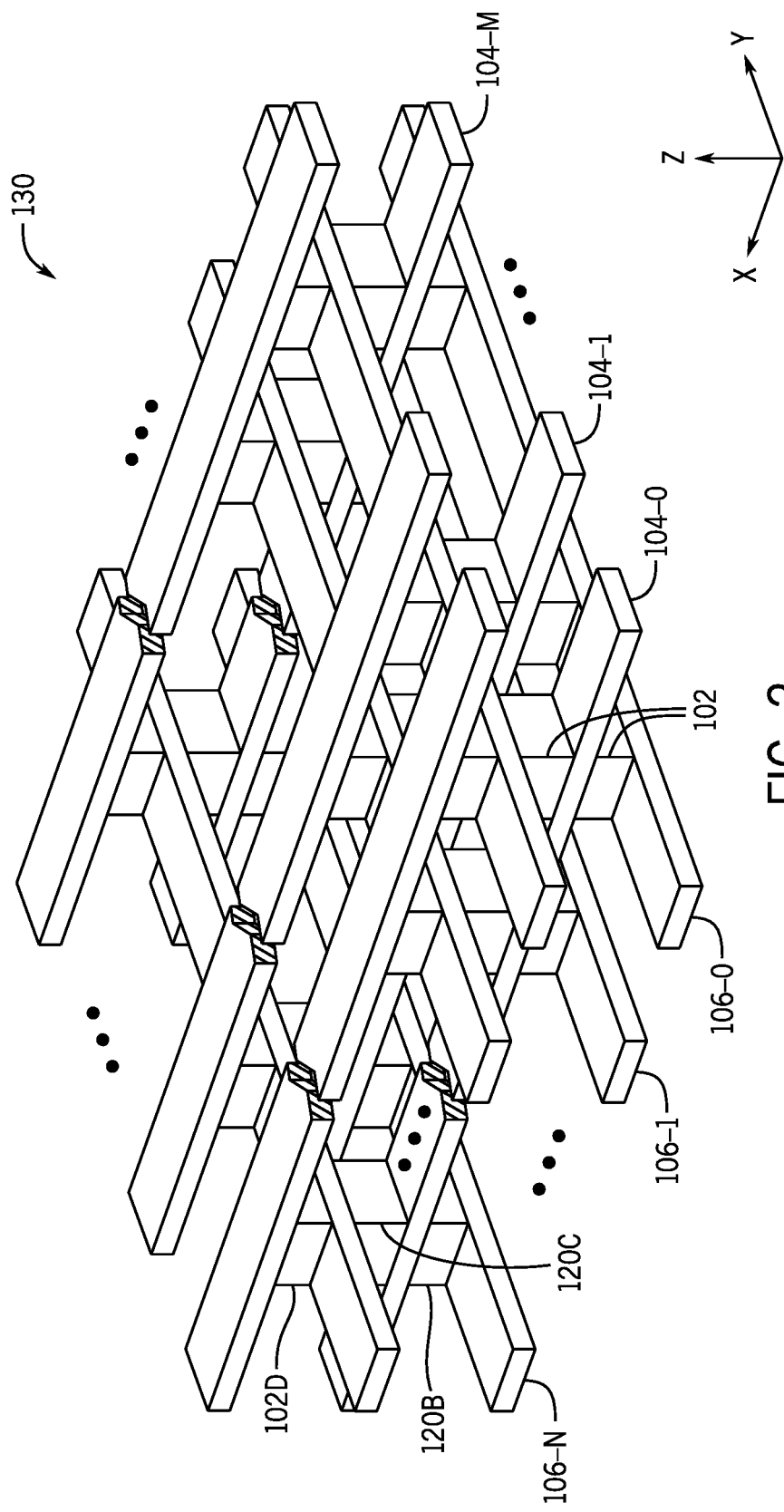
FIG. 2 is a side-view of a diagram illustrating the portion of the memory array of FIG. 1, according to an embodiment of the present disclosure.

FIG. 2 is a diagram illustrating a portion of a memory array 130 in accordance with an embodiment of the present disclosure. Inside the memory array 130, the memory cells are located at intersections of certain lines (e.g., orthogonal lines). The memory array 130 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular wordline 106 and the bitline 104 combination serving as the electrodes for the memory cell 102).

Each of the memory cells 102 may be resistance variable memory cells, such as resistive random-access memory (RRAIVI) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a selector device (SD) material) and/or a material layer that functionally replaces a separate memory element layer and selector element layer. The selector element (e.g., SD material) may be disposed between a wordline contact (e.g., a layer interface between a respective one of the wordlines 106 and the memory material) and a bitline contact (e.g., a layer interface between a respective one of the bitlines 104 and the selector element) associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current. For example, the current may be sensed on one or more bitlines 104/one or more wordlines 106 corresponding to the respective memory cells 102 in response to a particular voltage applied to the selected of the bitlines 104/wordlines 106 forming the respective memory cells 102.

As illustrated, the memory array 130 may be arranged in a cross-point memory array architecture (e.g., a three-dimensional (3D) cross-point memory array architecture) that extends in any direction (e.g., x-axis, y-axis, z-axis). The multi-deck cross-point memory array 130 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement.

Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 130 may include a three-dimensional matrix of individually-addressable (e.g., randomly accessible) memory cells 102 that may be accessed for data operations (e.g., sense and write) at a granularity as small as a single storage element and/or multiple storage elements. In some cases, the memory array 130 may include more or fewer bitlines 104, wordlines 106, and/or memory cells 102 than shown in the examples of FIG. 2. Each deck may include one or more memory cells 102 aligned in a same plane.

Figure 3:
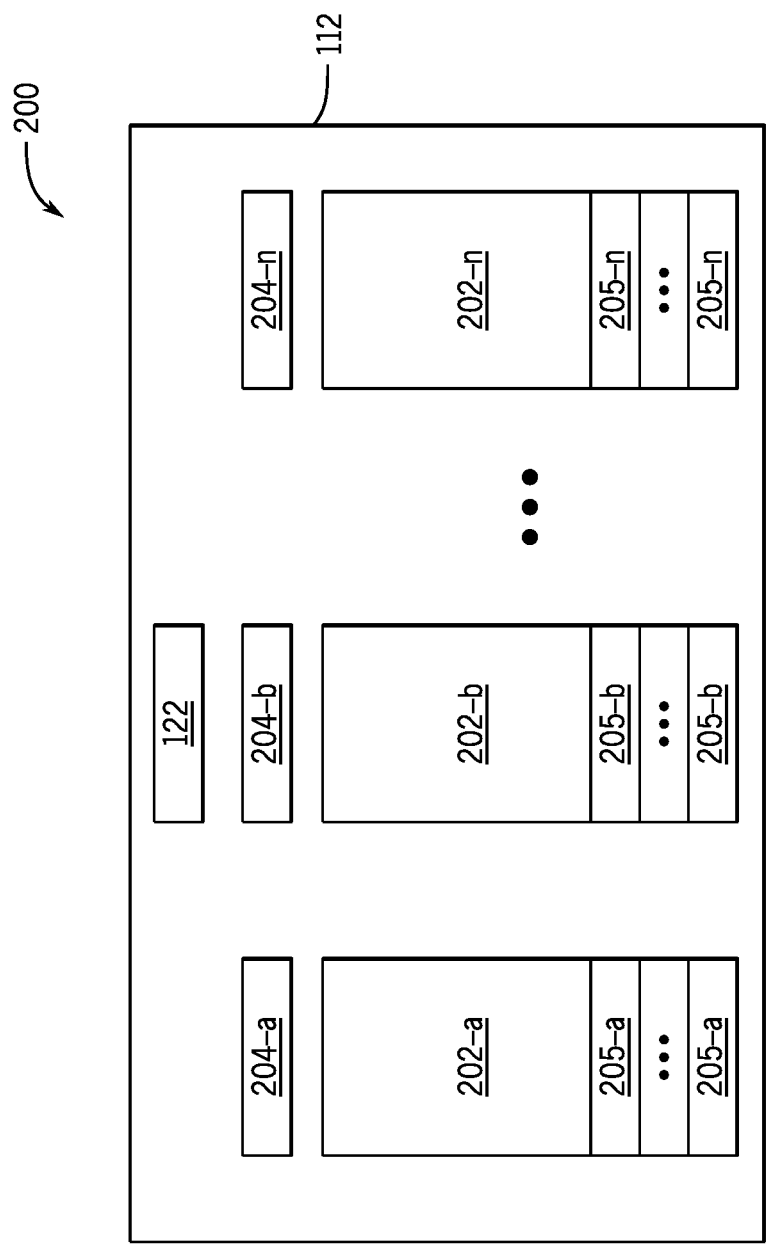
FIG. 3 is a block diagram of an embodiment of the memory device of FIG. 1 where the memory array has been partitioned into multiple partitions, according to an embodiment of the present disclosure.

FIG. 3 is a block diagram of an embodiment of a memory device 200 where the memory array 112 has been partitioned into multiple partitions 202 (e.g., partitions 202-a, 202-b . . . 202-n). Each partition 202 may include an associated local control circuit 204 (e.g., local control circuit 204-a, 204-b . . . 204-n). Further, each partition may be subdivided into tiles 205 (e.g., tiles 205-a, 205-b . . . 205-n). In some embodiments, the local control circuit 204 may be included in the control circuit 122 or interface with the control circuit 122. Accordingly, each partition 202 may operate independent from other partitions 202, which may enable parallel reads and writes of the memory array 112, including the use of parallel pre-read scans.

In some embodiments, the memory array 112 is a 3D cross point (3DXP) memory array, and each individual partition 220 is a 1 Gigabyte partition. The memory device 200 may include 16 of the 1 Gigabyte partitions. In some examples, the memory within each partition 202 may be accessed with 16 bytes of granularity, thus providing 26 bits of memory address information to memory array 110. Further, four bits can be used in this example to provide partition identification. It is to be noted that the particular partition sizes, number of partitions, and bits used for the commands and address operations described above are provided as examples only, and in other embodiments different partition sizes, numbers of partitions, and command/address bits may be used.

Figure 4:
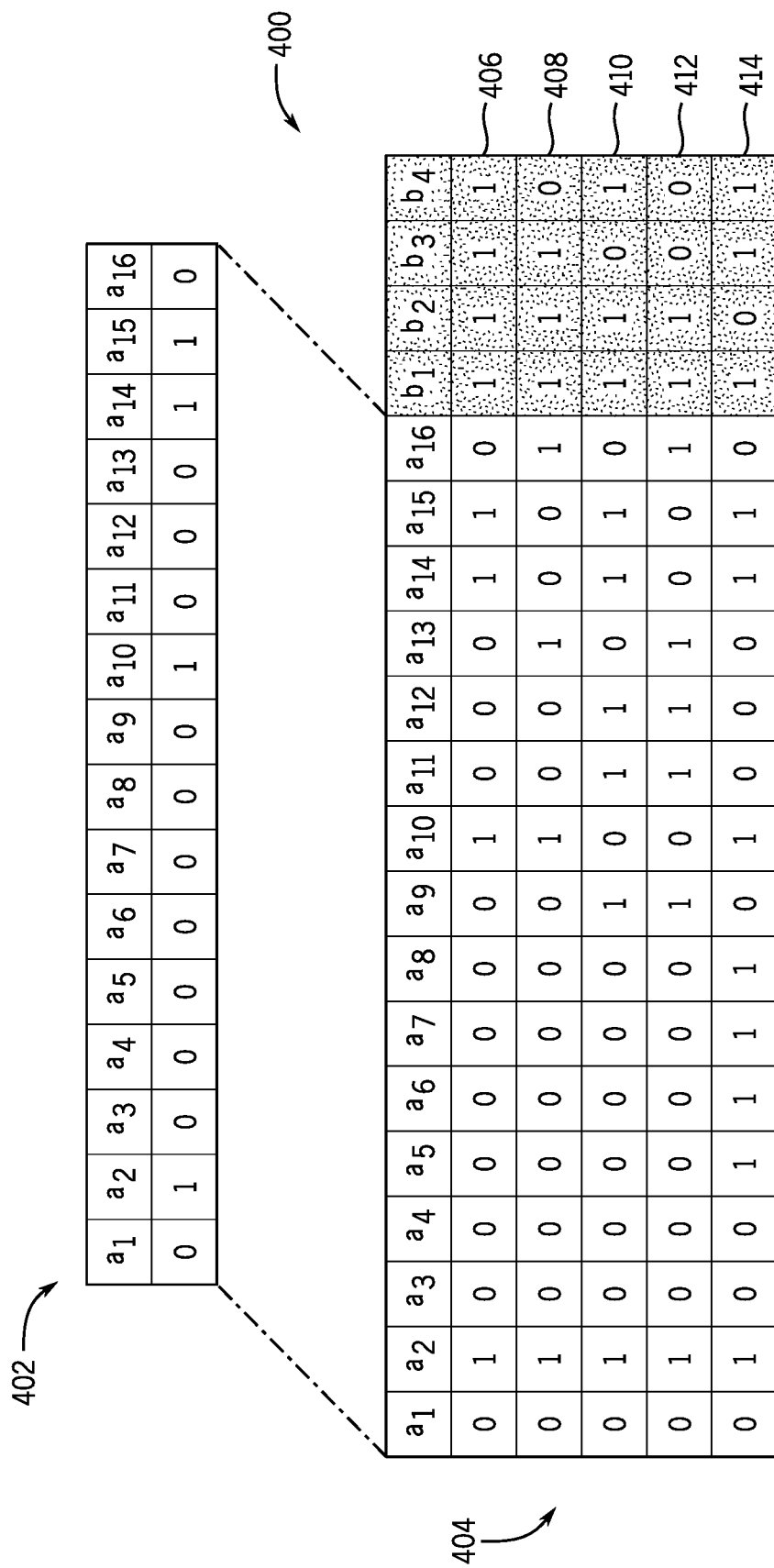
FIG. 4 is a block diagram of a user data pattern encoding technique, according to an embodiment of the present disclosure.

While the pre-scan read techniques described herein may work in any type of stored data, in some embodiments, the data stored in the memory array 112 may be encoded, for example, by adding certain encoding bits. The encoding data bits may enable faster reads, as further described below. Turning now to FIG. 4, the figure illustrates an embodiment of a user data pattern 400 that may be used by the pre-scan read techniques described herein. The user data pattern 400 illustrates a non-encoded user data 402 which may then be encoded as user data 404. The non-encoded user data 402 may be referred to as an input vector in some cases. The encoded user data 404 may include additional bits (e.g., b1 through b4). The additional bits may be referred to as flip-bits and may indicate a status of the user data, as described below.

The encoding technique described may generate an encoded user data having a weight (e.g., a number of bits having the logic state of 1 out of a total number of bits in the user data) within a predetermined interval. In some embodiments, the interval is 50% through (50+50k)% where k is a predetermined factor further described below. In some cases, the interval is expressed as [50%, (50+50k)%]. For example, when k is equal to 4, the interval may be 50% to 62.5% (e.g., [50%, 62.5%]). A different weight other than 50% as a lower bound of the interval may be used. Illustrations in FIG. 4 refer to 50% as a lower bound of the interval for a more concise description of the depicted features; however, other alternatives and different variations may be contemplated and fall within the scope of this disclosure.

By way of example, the user data 402 is shown as having 16 bits (e.g., a1 through a16). In a case in which k is equal to 4, the predetermined interval for the encoded user data to meet may be of [50%, 62.5%]. Various forms of the encoded user data 404, when k=4, are illustrated in FIG. 4. The encoding technique may add k number of flip-bits (e.g., b1 through b4 when k=4) to the user data 402 (e.g., a1 through a16) to generate the encoded user data 404. In addition, the original user data pattern may be partitioned into k number of portions (e.g., four portions or segments when k=4). For example, a first portion may include bits a1 through a4. The first portion may be associated with a first flip bit, b1. A second portion may include bits a5 through a8. The second portion may be associated with the second flip bit, b2. A third portion may include bits a9 through a12. The third portion may be associated with the third flip bit, b3. A fourth portion may include bits a13 through a16. The fourth portion may be associated with the fourth flip bit, b4. In some embodiments, initial values of b1 through b4 correspond to the logic state of 1 (e.g., 1111 of the encoded user data pattern 406). The logic state of 1 in the flip-bits may indicate that corresponding portions of the original user data are not inverted. Conversely, the logic state of 0 in the flip-bits may indicate that corresponding portions of the original user data are inverted.

As described above, the pre-scan read techniques described herein may determine a weight of the encoded user data pattern 404 as a percentage (e.g., adding the logic 1 bits and dividing the sum by the total number of unencoded bits). For example, the encoded user data 560-a has a weight of 25% (e.g., 4 bits having the logic state of 1 out of 16 bits in the user data), which does not meet the predetermined interval of [50%, 62.5%] when k=4. Further, the encoding technique may vary the logic states of the flip-bits throughout all possible combinations of logic states of the flip-bits to find a particular encoded user data that has a particular weight within the predetermined interval (e.g., an interval of [50%, 62.5%] when k=4). When there are k flip-bits (e.g., k=4), there are a total of 2^k (e.g., 2^4=16) combinations, such as 1111, 1110, 1101, 1100, . . . , 0001, and 0000.

When a logic state of a flip-bit corresponds to the logic state of 0, the pre-scan read may invert the logic states of the corresponding portion of the user data and evaluate a weight. As illustrated, user data 406 does not include any inversions, and thus all flip-bits are set to 1. Inversion of data may then occur. By way of example, when the flip-bits are 1110 as shown in the encoded user data 408, the logic states of the fourth portion (e.g., bits a13 through a16) are inverted to 1001 from 0110. Then, the encoding technique may determine that the encoded user data pattern 408 has a weight of 25% (e.g., 4 bits having the logic state of 1 out of 16 bits in the user data), which does not meet the predetermined condition of the weight within the interval of [50%, 62.5%]. The encoding technique may restore the logic states of the fourth portion back to 0110 and vary the content of the flip-bits to a next combination (e.g., 1101 as shown in the encoded user data 410). The encoding technique may invert the logic states of the third portion (e.g., bits a9 through a12) to 1011 from 0100 as shown in the encoded user data 410 and determine that the encoded user data pattern 410 has a weight of 38% (e.g., 6 bits having the logic state of 1 out of 16 bits in the user data), which also does not meet the predetermined condition of the weight within the interval of [50%, 62.5%].

The pre-scan read may continue varying the content of the flip-bits, inverting logical values of the bits of corresponding portions of the user data according to the flip-bits, and thereby evaluating weights of the encoded user data until an encoded user data meets the predetermined condition (e.g., the interval of [50%, 62.5%]). For example, the encoded user data 412 has a weight of 38% and does not meet the predetermined condition of [50%, 62.5%] weight interval. The encoded user data pattern 414 has the flip-bit contents of 1011 and the second portion of the user data (e.g., bits a5 through a8) are inverted to 1111 from 0000. The weight of the encoded user data 414 is 50% (e.g., 8 bits having the logic state of 1 out of 16 bits in the user data), which meets the predetermined condition of having the weight between [50%, 62.5%].

The coding technique may stop varying the content of the flip-bits based on determining that the encoded user data pattern 414 meets the predetermined condition and the coded user data pattern 414 may be stored in memory cells. The flip-bit contents (e.g., 1011) may then be used to decode the encoded user data when reading the encoded user data from the memory cells. For example, the logic states of bits a5 through a8 (e.g., 1111) of the encoded user data 414 may be inverted back to their original logic states (e.g., 0000) based on the value of the flip-bit, b2 (e.g., the logic state of 0 of b2 indicating the bits a5 through a8 having been inverted) when reading the encoded user data 414. By storing encoded bits at a desired weight range, the techniques described herein may more quickly read the data stored in the memory device 100.

Figure 5:
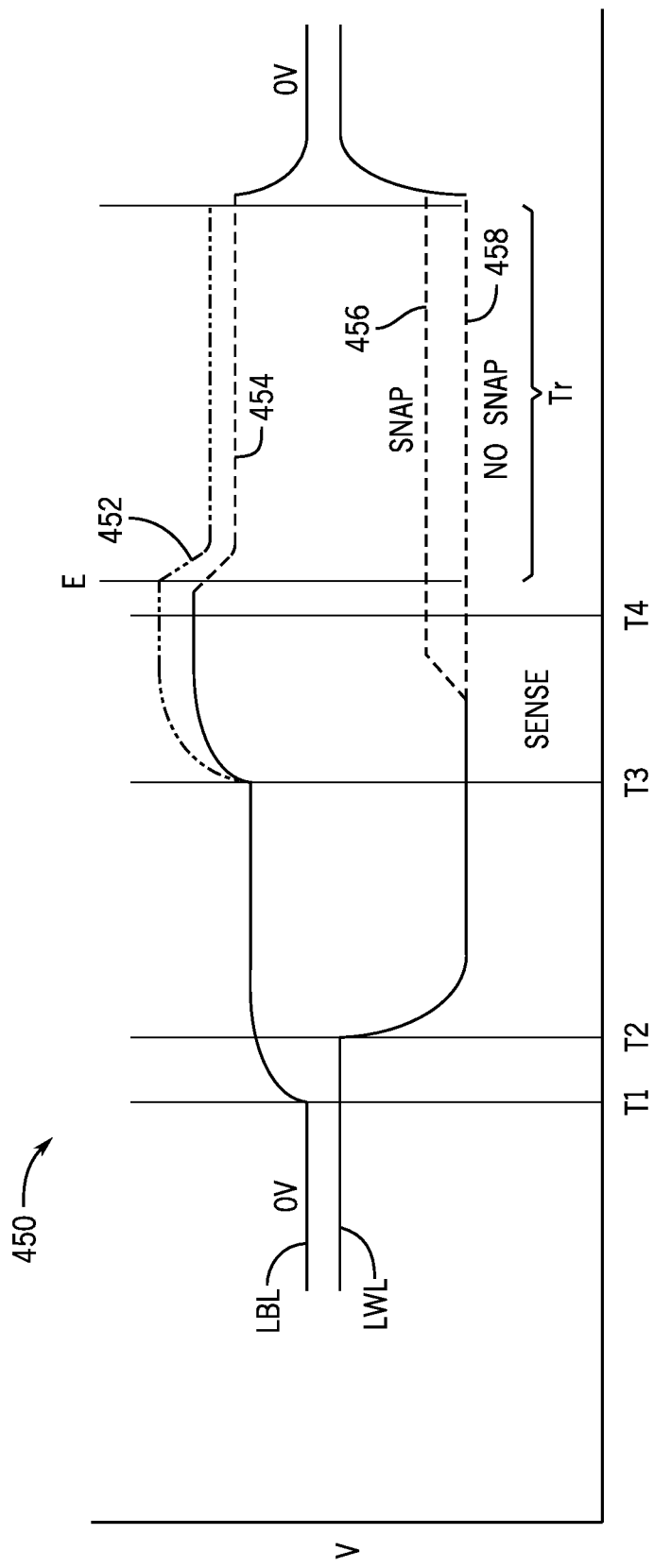
FIG. 5 is a timing diagram illustrating ramping voltages (e.g., read voltages) that may be applied to the memory array of FIG. 1 to read data, according to an embodiment of the present disclosure.

It may be beneficial to describe a ramping read technique illustrating certain reading of data. Turning now to FIG. 5, the figure is a timing diagram or graph 450 illustrating ramping voltages that may be applied through bitlines 104 and/or wordlines 106 to result in the reading of data. In the illustrated embodiment, the graph 450 includes an X axis representative of time, and a Y axis representative of voltage. As time progresses in the Y direction, voltages LBL and LWL may be applied, representative of bitline 104 voltages and wordline 106 voltages respectively, creating bias voltages at a memory cell 102. Using a ramping approach, the LBL voltage may start at approximately 0 volts, and then ramp up at time T1 to a higher voltage, with LWL going to a negative voltage at time T2. The LBL voltage may then be ramped up to a higher voltage at time T3. Some SET memory cells 102 may be switched on beginning at time T2, with more SET cells being switched on at time T3, and so on, until all or most all SET cells have switched on. A sensing of memory cells 102 may then occur at time T4 to read data (e.g., based on memory cells 102 switching).

"Snapbacks" may occur as the data is read, which may lead to undesired changes in voltages LBL and/or LWL. For example, read voltages may be disturbed due to snapback discharge effects of the memory cells 102. For example, at a time range Tr the snapback effects are shown such that the LBL voltage is lower and the LWL is not as negative. For example, snapbacks 452 related to SET memory cells 102, snapbacks 454 related to RESET memory cells 102, and snapbacks 456 related to wordline use may be experienced by the memory array 112. Using the ramp approach shown in the figure to derive a VDM value via drift analysis may be more complex because of the extra accounting of the sense impact time due, for example, to the snapback effect.

For example, a drift tracking system may be used that tracks drift over time for each tile 205 by analyzing a sense time as a function of drift. For example, SET and RESET threshold voltages and their respective drifts may be a function of different sense times (e.g., time spent at a given sub-threshold bias voltage). However, the drift tracking system may not only use more memory (e.g., because it may have to track all tiles 205 in a partition 202), but also may have to include extra complexity to account for the snapback effect. Rather than tracking drift over time, for example, for each tile 205, the techniques described herein may use a modified read process, where a first pre-read scan and data analysis step are performed, before following up with a subsequent read step, as shown in FIG. 6.

Figure 6:
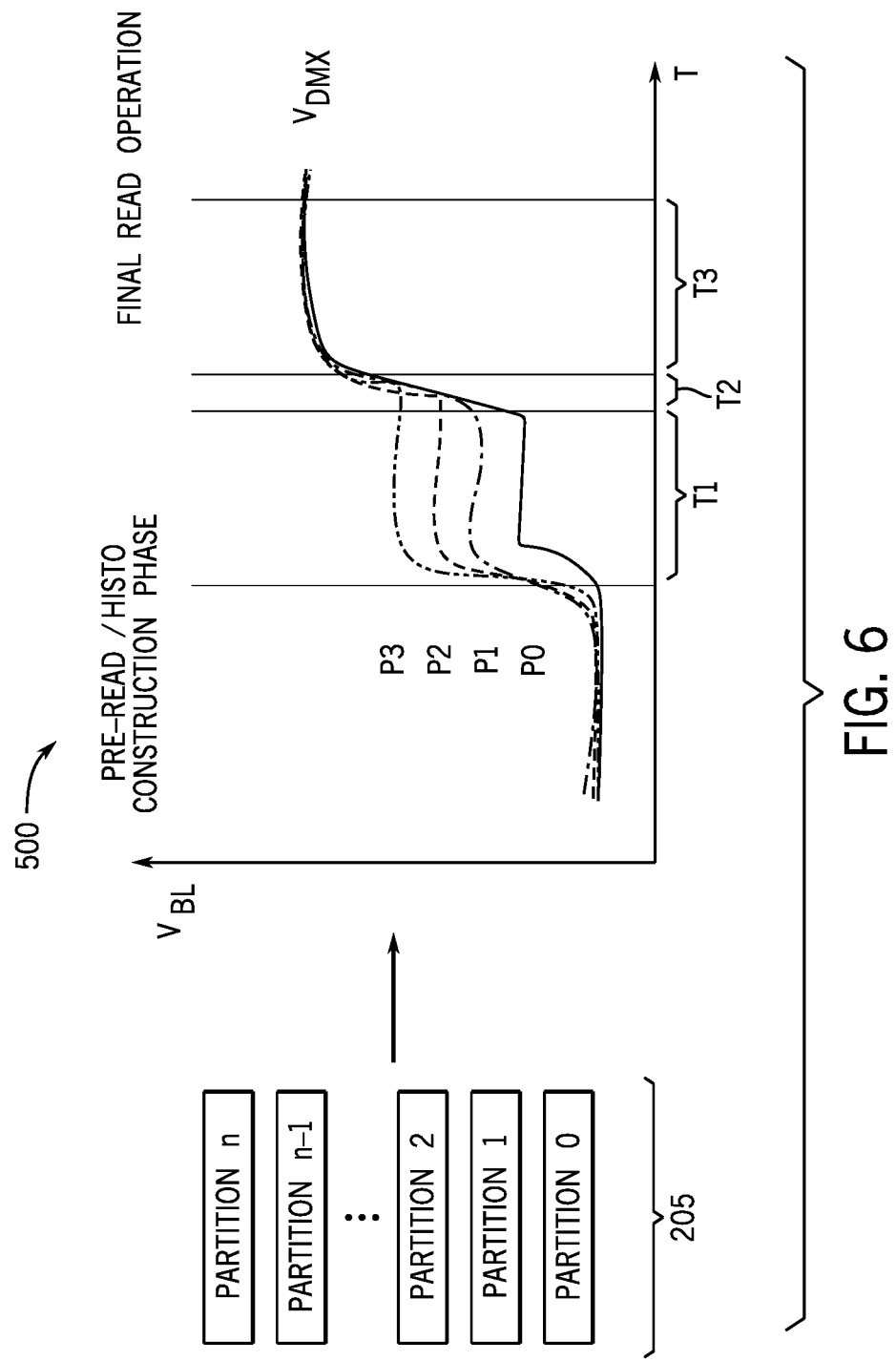
FIG. 6 illustrates certain partitions included in the memory array of FIG. 1 and a timing that may utilize one or more of the partitions, according to an embodiment of the present disclosure.

FIG. 6 illustrates multiple partitions 202 that may be used to generate pre-read voltages that may then be used to determine a more optimal VDM. In the depicted embodiment, each partition 202 may receive a different VDM pre-scan read voltage. In some embodiments, all of the partitions 202 may each receive a different VDM pre-scan read voltage. In other embodiments, a subset of the partitions 202 may be used. In certain embodiments, the VDM pre-scan read voltages may use the parallelism provided by the partitions 202 to deliver the VDM pre-scan read voltages in parallel to each partition 202 (or subset of the partitions 202). That is, a first pre-scan read step may be performed in parallel by transmitting multiple VDM pre-scan voltages, one VDM pre-scan voltage per partition.

In the depicted embodiment, a timing graph or diagram 500 illustrates the use of the pre-scan read step. More specifically graph 500 includes an X axis representative of time and a Y axis representative of voltage (e.g., bitline voltage VBL). During time range T1, multiple partitions 202 may be receiving different VDM pre-scan voltages in parallel, and data results may then be sensed for the data stored in each partition. Based on the data sensing, a distribution of bits (e.g., percent bits found as having logic 1) may be derived for each partition, for example at time range T2. As mentioned earlier, the bits should have an approximate 50% logic 1 distribution, or be in a range where logic 1 is between 35% to 65% of the total number of bits. Additionally, encodings such as those described in FIG. 4 may be used to provide for more evenly distributed logic 1 and logic 0 bits.

Some of the data distributions may be outside of the desired range. Accordingly, it may be derived that the VDM pre-scan voltages delivered to partitions that resulted in data distributions outside of the desired range may not be as optimal as VDM pre-scan voltages that resulted in more evenly distributed data. In some embodiments, time range T2 may be used for further data analysis. For example, certain statistical techniques, such as Montecarlo methods, probability analysis, and so on, may be used at time T2. For example, the control circuitry 122 may include Montecarlo analysis and/or model building that derives possible results (e.g., a more optimal VDM) by substituting a range of values (e.g., probability distribution such as a bell curve) based on the results from the pre-scan step at time range T1. In other embodiments, the more optimal VDM may be derived by adding/subtracting based on the pre-scan read results. For example, if a read step was going to use a VDM value V, V would now be adjusted up or down based on the value for the more optimal VDM pre-scan voltage.

As mentioned, multiple VDM pre-scan voltages may be used. If higher voltages are found to derive improved data distributions then the VDM value V would be adjusted up, and likewise, if lower voltages are found to derive improved data distributions then the VDM value V would be adjusted down. The adjustment amount may be pre-calculated and/or derived for a read request by the control circuitry 122 based on how "far" the read values are from an ideal data distribution (e.g., 50% distribution of logic 1s).

Figure 7:
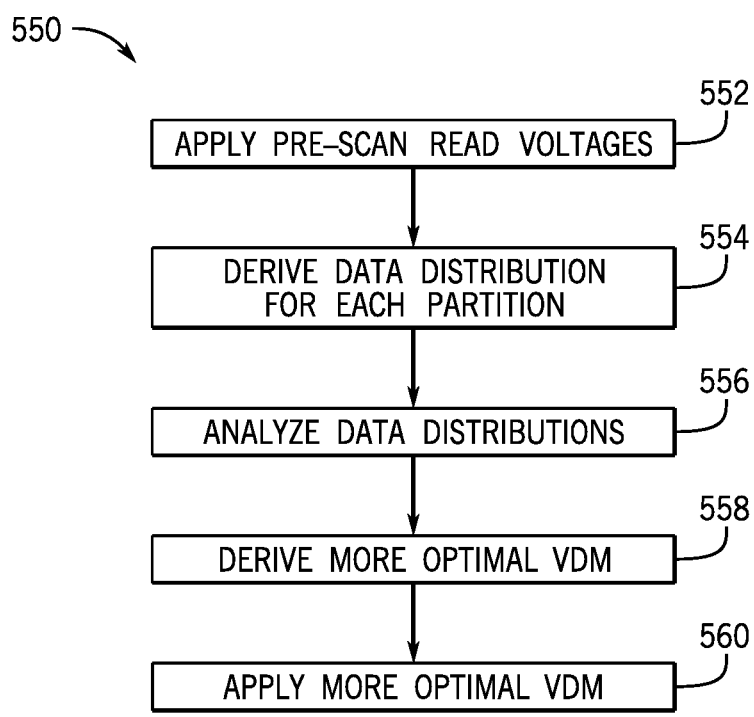
FIG. 7 is a flowchart of a process suitable for a pre-scan reading of data stored in the memory array of FIG. 1, according to an embodiment of the present disclosure.

FIG. 7 is a flowchart of an embodiment of a process 550 that may be used to apply the pre-scan read techniques described herein. The process 550 may be implemented, for example, by the control circuit 122. In the depicted example, the process 550 may begin by applying (block 552) multiple pre-scan read voltages. In certain embodiments, each partition 202 of a memory device 10 may receive a different read voltage. In other embodiments, a subset of the partitions 202 may be used, and each partition 202 in the selected subset may then receive a different read voltage.

The read voltages may be applied (block 552), for example, via the bitlines 104 and the wordlines 106 for each partition 202. In one embodiment, the read voltages may be applied in parallel. In other embodiments, the read voltages may be applied serially, in parallel, or a combination thereof (a first subset applied serially and/or a second subset applied in parallel). In some embodiments, the some of the read voltages may be the same, for example, for redundancy, while in other embodiments each read voltage may have a different value.

The process 550 may then receive (block 554) the data being read, for example, from the partitions 202. The process 550 may derive (block 554) the data distribution for the data that was read. In one embodiment, the data distribution may be a metric such as percentage of logic 1's found in the data for a given partition (e.g., codeword in a partition). The derived data distributions (block 554) may then be analyzed (block 556). For example, the derived data distributions may be compared against a desired range (e.g., 35% to 65%) to see which one or more of the derived data distributions more closely falls inside of the desired range.

The process 550 may then derive (block 558) a more optimal VDM to apply in a second read step. For example, Montecarlo methods, probability analysis, and so on, may be used. As mentioned above Montecarlo analysis and/or model building that may be used to derive a more optimal VDM (block 558) by substituting a range of values (e.g., probability distribution such as a bell curve) based on the results from the pre-scan step 554. In other embodiments, the more optimal VDM may be derived (block 558) by adding or subtracting based on the pre-scan read results (block 554). For example, if a read step was going to use a VDM value V, V would now be adjusted up or down based on the value for the more optimal VDM pre-scan voltage.

The process 550 may then apply (block 560) the more optimal VDM during a second step. In one embodiment, the second step may be a final step for the application of read voltages. In other embodiments, one or more further read voltage steps may be used. By applying a first pre-scan read and a second more optimal VDM read, the techniques described herein may enable a more optimal and efficient read of data stored in the memory device 10.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
   a memory array comprising a plurality of memory cells;
   a control circuit operatively coupled to the memory array, the control circuit configured to:
      receive a read request for data;
      apply a plurality of read voltages to the memory array based on the read request, wherein the plurality of read voltages are applied in parallel via a plurality of partitions included in the memory array, and wherein each voltage value of the plurality of read voltages is different from each other;
      perform a data analysis for a first set of data read based on the application of the plurality of read voltages;
      derive a demarcation bias voltage (VDM) based on the data analysis; and
      apply the VDM to the memory array to read a second set of data.

2. The memory device of claim 1, wherein the data analysis comprises deriving a data distribution for data read via each read voltage in the plurality of read voltages.

3. The memory device of claim 2, wherein the data distribution comprises a percentage of logic 1s found in the data.

4. The memory device of claim 1, wherein the control circuit is configured to derive the VDM by selecting a data distribution that falls inside of a desired range.

5. The memory device of claim 4, wherein the desired range comprises between 35% and 65% of logic 1's found in the data.

6. The memory device of claim 1, wherein the data analysis comprises a Montecarlo analysis, a probability distribution analysis, or combination thereof.

7. The memory device of claim 1, wherein the control circuit is configured to apply the VDM by using the VDM to read the second set of data from a plurality of partitions included in the memory array.

8. A method, comprising:
   receiving, at a control circuit included in a memory device, a read request for data;
   transmitting a pre-scan read to a memory array based on the read request wherein the pre-scan read comprises transmitting in parallel two or more read voltages to two or more partitions included in the memory array, and wherein each of the two or more read voltages is different from each other;
   performing a data analysis for a first set of data read based on the transmission of the pre-scan read;
   deriving a demarcation bias voltage (VDM) based on the data analysis; and
   applying the VDM to the memory array to read a second set of data.

9. The method of claim 8, wherein performing the data analysis comprises deriving a plurality of data distributions for the first set of data and selecting a data distribution of the plurality of data distributions that more closely falls inside of a desired range.

10. The method of claim 9, wherein the desired range comprises between 35% and 65% of logic 1's found in the data.

11. The method of claim 8, wherein applying the VDM to the memory array comprises a final application of a read voltage for the read request.

12. A memory device, comprising:
a memory array comprising a plurality of memory cells;
a control circuit operatively coupled to the memory array, the control circuit configured to:
receive a read request for data;
transmit a plurality of read voltages in parallel into the memory array to read a first set of data, wherein the plurality of read voltages are transmitted into a plurality of partitions included in the memory array, and wherein each value of the plurality of read voltages is different from each other;
perform a data analysis for the first set of data;
derive a demarcation bias voltage (VDM) based on the data analysis; and
apply the VDM to the memory array to read a second set of data.

13. The memory device of claim 12, wherein the control circuit is configured to perform the data analysis by deriving a plurality of data distributions for the first set of data and by selecting a data distribution of the plurality of data distributions that more closely falls inside of a desired range.

14. The memory device of claim 12, wherein the data analysis comprises a Montecarlo analysis, a probability distribution analysis, or combination thereof.

15. The memory device of claim 12, wherein the control circuit is configured to apply the VDM to the plurality of partitions included in the memory array.

16. The memory device of claim 1, wherein the control circuit is configured to apply the plurality of read voltages in parallel via a subset of the plurality of partitions.

17. The memory device of claim 1, wherein the control circuit is configured to apply a second plurality of read voltages to the memory array based on the read request, wherein the second plurality of read voltages are applied serially via a plurality of partitions included in the memory array, and wherein each voltage value of the plurality of read voltages is different from each other.

18. The method of claim 8, wherein the VDM is adjusted up or down based on the pre-scan read.

19. The method of claim 8, wherein the data analysis comprises a Montecarlo analysis, a probability distribution analysis, or combination thereof.

20. The memory device of claim 13, wherein the plurality of data distributions comprises a percentage of logic is found in the data.

* * * * *